US009423466B2

(12) United States Patent
Murakami

(10) Patent No.: US 9,423,466 B2
(45) Date of Patent: Aug. 23, 2016

(54) SEMICONDUCTOR CIRCUIT AND SEMICONDUCTOR DEVICE

(75) Inventor: Yoshihiro Murakami, Tokyo (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 838 days.

(21) Appl. No.: 13/211,463

(22) Filed: Aug. 17, 2011

(65) Prior Publication Data

US 2012/0044010 A1 Feb. 23, 2012

(30) Foreign Application Priority Data

Aug. 18, 2010 (JP) ................................. 2010-183292

(51) Int. Cl.
*H02J 7/00* (2006.01)
*G01R 31/36* (2006.01)
*H01M 10/44* (2006.01)
*H01M 10/48* (2006.01)
*H01M 10/0525* (2010.01)

(52) U.S. Cl.
CPC ......... *G01R 31/3658* (2013.01); *H01M 10/441* (2013.01); *H01M 10/482* (2013.01); *G01R 31/362* (2013.01); *H01M 10/0525* (2013.01); *Y02T 10/7011* (2013.01)

(58) Field of Classification Search
CPC ..... H02J 7/0013; H02J 7/0014; H02J 7/0016; H02J 7/0018; H02J 7/0019; H02J 7/0021; H02J 7/0022; H02J 7/0026; H02J 7/0029; H02J 7/0037; H02J 7/0039; H02J 7/007; H02J 7/0072; H02J 7/2007; H02J 7/004
USPC .......... 320/116, 118, 124, 134; 327/333, 334, 327/335, 100, 103
See application file for complete search history.

(56) References Cited

U.S. PATENT DOCUMENTS

| | | | | |
|---|---|---|---|---|
| 7,091,695 B2* | 8/2006 | Miyazaki | ............... | H02J 7/0026 320/116 |
| 7,486,050 B2* | 2/2009 | Hidaka | ............ | G01R 19/16542 320/116 |
| 7,564,216 B2* | 7/2009 | Carrier | .................. | H02J 7/0021 320/116 |
| 7,638,979 B2* | 12/2009 | Vandensande | ..... | G01R 31/3658 320/118 |
| 7,741,814 B2* | 6/2010 | Yamamoto | ............ | H02J 7/0021 320/116 |
| 8,212,523 B2* | 7/2012 | Tatebayashi | .......... | H02J 7/0016 320/116 |
| 2001/0011881 A1* | 8/2001 | Emori | .............. | G01R 19/16542 320/116 |

(Continued)

FOREIGN PATENT DOCUMENTS

JP 2009-027916 A 2/2009

*Primary Examiner* — Richard Isla Rodas
*Assistant Examiner* — Michael Dibenedetto
(74) *Attorney, Agent, or Firm* — Kubotera & Associates, LLC

(57) ABSTRACT

In a semiconductor circuit, a high frequency level detecting unit detects a level of a high frequency component adjusted with a first adjusting unit, and a first control unit controls a first gain of the adjusting unit according to the level of the high frequency component thus detected. Further, a low frequency level detecting unit detects a level of a low frequency component adjusted with a second adjusting unit. A second control unit controls a second gain according to the level of the high frequency component and the level of the low frequency component thus adjusted, so that a difference between the level of the high frequency component adjusted with the first adjusting unit and the level of the low frequency component adjusted with the second adjusting unit becomes smaller than a specific level determined in advance.

16 Claims, 6 Drawing Sheets

(56) References Cited

U.S. PATENT DOCUMENTS

| | | | |
|---|---|---|---|
| 2006/0176019 A1* | 8/2006 | Xiao | H04L 12/40 320/116 |
| 2007/0139006 A1* | 6/2007 | Yasuhito | H01M 10/441 320/116 |
| 2007/0139007 A1* | 6/2007 | Lim | G01R 31/3658 320/116 |
| 2007/0268000 A1* | 11/2007 | Kobayashi | H02J 7/0019 320/118 |
| 2011/0068735 A1* | 3/2011 | Nicholson et al. | 320/107 |

* cited by examiner

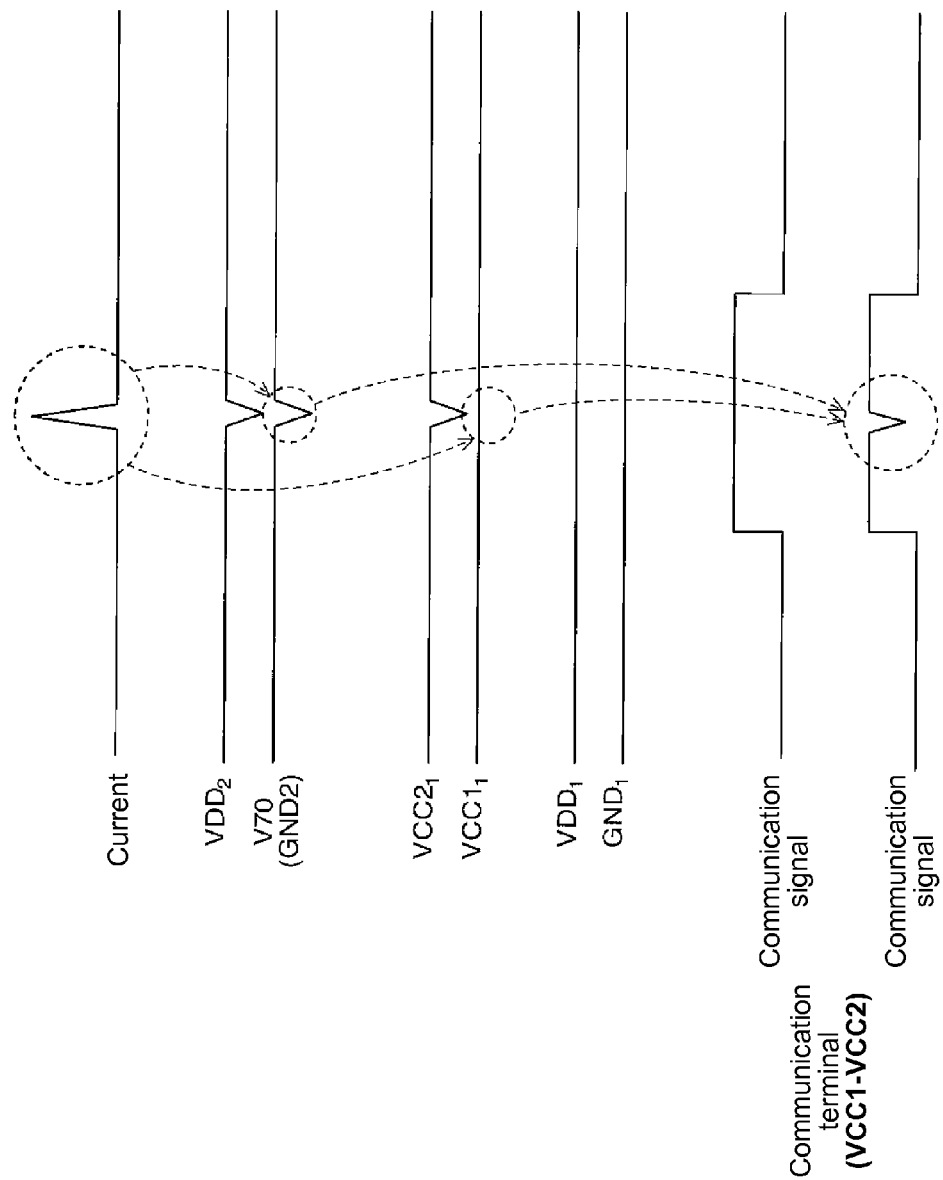

SEMICONDUCTOR CIRCUIT AND SEMICONDUCTOR DEVICE

BACKGROUND OF THE INVENTION AND RELATED ART STATEMENT

The present invention relates to a semiconductor circuit and a semiconductor circuit. More specifically, the present invention relates to a semiconductor circuit and a semiconductor device for monitoring a battery voltage.

Recently, a high output battery with a large capacity has been widely used for driving a motor of a hybrid vehicle or an electric vehicle. In general, such a high output battery is formed of a plurality of batteries (battery cells) connected in series (as an example, a lithium-ion battery and the likes).

It has been known that a battery monitoring system is provided for monitoring and controlling a voltage of the battery cells of the high output battery. The battery monitoring system is composed of a measurement semiconductor circuit and a control semiconductor circuit, so that the battery monitoring system can monitor and control a voltage of the battery cells of the high output battery. When the battery monitoring system monitors and controls a voltage of the battery cells of the high output battery, various control signals (command signals) and data signals are exchanged between the measurement semiconductor circuit and the control semiconductor circuit. Patent Reference has disclosed a technology for reducing an influence on the command signals and the data signals due to external noises and the likes.

Patent Reference Japanese Patent Publication No. 2009-27916

FIG. 5 is a block diagram showing a configuration of a conventional semiconductor device 110 as the battery monitoring system. As shown in FIG. 5, the conventional battery monitoring system includes a battery 114 having a plurality of battery cell groups 115 and a semiconductor device 110 for measuring and controlling a voltage of battery cells 117 of the battery 114.

In the conventional battery monitoring system, a control semiconductor circuit 112 transmits a command (a signal) to a measurement semiconductor circuit 120. Accordingly, a cell voltage equalization process (equalizing the voltage of each of the battery cells 117) or a charging discharging control process (controlling charging and discharging of each of the battery cells 117) of the battery 114 are performed according to voltage information of each of the battery cells 117 obtained from the measurement semiconductor circuit 120.

In the conventional battery monitoring system, the measurement semiconductor circuit 120 is provided for each of the battery cell groups 115. In the following description, when it is necessary to differentiate each of the control semiconductor circuits 120, a subscript number is attached to the reference numeral. When the control semiconductor circuits 120 are referred collectively, the subscript number is omitted.

In the conventional battery monitoring system, the measurement semiconductor circuit 120 includes an IO circuit 122 for operating at a GND-VDD level on a low potential side and an IO circuit 132 for operating at a VCC-VCC2 level on a high potential side. Accordingly, the control semiconductor circuits 120 are configured to mutually exchange the command signals and the data signals such as measurement results without passing through a power source separation element. Further, the measurement semiconductor circuit 120 includes a logic circuit 124, an A/D conversion circuit 126, a cell selection circuit 128, a level shift circuit 130, and a voltage adjustment circuit 134.

In the conventional battery monitoring system, the measurement semiconductor circuit 120 further includes a VCC terminal connected to a power source line 113 of the battery 114; a VDD terminal for externally outputting an output voltage VDD of the voltage adjustment circuit 134; a VCC2 terminal connected to the measurement semiconductor circuit 120 on an upper stage; and Vn terminals (n=0 to n, n is an integer). The VCC terminal is provided for supplying a power source voltage to drive the cell selection circuit 128, the level shift circuit 130, and the voltage adjustment circuit 134, and for supplying a reference voltage of the IO circuit 132. The VCC2 terminal is provided for supplying a power source voltage of the IO circuit 132.

In the conventional battery monitoring system, in order to stabilize the power source voltage, an RC filter 119 is disposed between the VCC terminal and the power source line 113, and an LPF 118 is disposed between each of the Vn terminals and the power source line 113. A GND terminal is directly connected to the power source line 113.

In the conventional battery monitoring system, when the voltage of the battery cells $117_{11 \sim n1}$ is measured, the control semiconductor circuit 112 transmits the command signal to the semiconductor circuit $120_1$ for measuring the voltage of the battery cells $117_{11 \sim n1}$. When the command signal is input to the IO circuit $122_1$ of the semiconductor circuit $120_1$ through a communication terminal $135_1$, the logic circuit $124_1$ determines whether the command signal is the command signal for measuring the voltage of the battery cells $117_{11 \sim n1}$ connected to the semiconductor circuit $120_1$.

When the logic circuit $124_1$ determines that the command signal is not the command signal for measuring the voltage of the battery cells $117_{11 \sim n1}$ the logic circuit $124_1$ outputs the command signal as is to the level shift circuit $130_1$. The level shift circuit $130_1$ level shifts the command signal input at the GND-VDD level to the VCC-VCC2 level, and outputs the command signal to the semiconductor circuit $120_2$ at the upper stage through the communication terminal $136_1$.

When the logic circuit $124_1$ determines that the command signal is the command signal for measuring the voltage of the battery cells $117_{11 \sim n1}$ connected to the semiconductor circuit $120_1$, the cell selection circuit $128_1$ selects one of the battery cells $117_{11 \sim n1}$ whose voltage the command signal instructs to be measured. Then, the cell selection circuit $128_1$ outputs the data signal indicating the voltage of the one of the battery cells $117_{11 \sim n1}$ the control semiconductor circuit 112 through the transmission path through which the command signal is transmitted.

As described above, in the conventional semiconductor device 110, the command signal and the data signal indicating the voltage measurement result (the voltage of the battery cells 117) are exchanged through the communication terminals 135 and 136.

In the conventional battery monitoring system, an RC filter substantially equivalent to the RC filter 119 may be disposed between the GND terminal and the power source line 113, so that the GND potential does not fluctuate to a large extent. In this case, for example, when the battery cells 117 are charged, it is possible to supply the voltage to the GND terminal without a large fluctuation.

However, when the voltage of each of the battery cells 117 changes significantly while the battery cells 117 are being charged, the voltage input to the terminals V0 to Vn (referred to as Vo to Vn levels) changes significantly. Accordingly, a potential difference between the GND level and the Vo to Vn levels is shifted, or the GND level exceeds the Vo to Vn levels, thereby causing a false operation of the semiconductor circuit 120.

To this end, in the conventional semiconductor device 110 shown in FIG. 5, the GND terminal is directly connected to the power source line 113. Accordingly, even when the voltage of each of the battery cells 117 changes significantly while the battery cells 117 are being charged or a motor is driven, and the voltage input to the terminals V0 to Vn (referred to as Vo to Vn levels) changes significantly, it is possible to change the voltage supplied to the GND terminal of the semiconductor circuit 120. As a result, it is possible to prevent the GND level from exceeding the Vo to Vn levels, thereby preventing a false operation of the semiconductor circuit 120.

It is noted that, in the conventional semiconductor device 110 shown in FIG. 5, the GND terminal is directly connected to the power source line 113. Alternatively, an RC filter with a low property (a level lower than the RC filter 119) may be disposed between the GND terminal and the power source line 113

In the semiconductor circuit 120 of the conventional semiconductor device 110 shown in FIG. 5, it is difficult to reduce a noise in the following circumstance, thereby causing a problem.

In a hybrid vehicle or an electric vehicle driving, when a motor is driven, a load current is generated. Further, when a brake is applied, a charging current is generated in a regenerative brake system, so that the charging current is reused using the motor as a generator. Due to the load current or the charging current, the battery voltage tends to change significantly, and the change influences as the noise.

In the conventional semiconductor device 110 shown in FIG. 5, the change in the battery voltage may invert a logic level of the communication signal, thereby causing a false operation as shown in FIG. 6. FIG. 6 is a graph for explaining the false operation of the conventional semiconductor device 110.

In the conventional semiconductor device 110 shown in FIG. 5, when the load current and the like are generated in the battery cell group 115$_2$, the battery voltage decreases by an internal resistance of the battery cells 117. Accordingly, a voltage V70 (the GND level (GND$_2$)) of the semiconductor circuit 120$_2$) decreases, thereby decreasing the voltage.

As explained above, in the semiconductor circuit 120 of the conventional semiconductor device 110 shown in FIG. 5, the GND terminal is directly connected to the power source line 113. Accordingly, even when the voltage of each of the battery cells 117 changes significantly while the battery cells 117 are being charged or the motor is driven, and the Vo to Vn levels change significantly, it is possible to prevent the potential of the GND level from shifting relative to those of the Vo to Vn levels, and to prevent the GND level from exceeding the Vo to Vn levels, thereby preventing the false operation of the semiconductor circuit 120.

It is noted that when the GND terminal is directly connected to the power source line 113, the voltage supplied to the GND terminal of the semiconductor circuit 120 changes according to the change in the Vo to Vn levels. As a result, the voltage V70 (the GND level (GND$_2$)) of the semiconductor circuit 120$_2$) changes as well. When the GND level (GND$_2$) of the semiconductor circuit 120$_2$ changes, a voltage VCC2$_1$ (the GND level (GND$_2$) of the semiconductor circuit 120$_2$) input into the VCC2$_1$ terminal of the semiconductor circuit 120$_1$ changes as well.

As explained above, the RC filter 119$_1$ is connected to the VCC1 terminal of the semiconductor circuit 120$_1$. Accordingly, due to the filter effect of the RC filter 119$_1$, a high frequency component is cut, and the voltage VCC$_1$ does not change significantly. In sum, the voltage VCC2$_1$ does change and the voltage VCC$_1$ does not change. Accordingly, when the voltage exceeds the threshold value, the logic level of the signal input into the IO circuit 132$_1$ through the communication terminal 136$_1$ is inverted, thereby causing the false operation.

In view of the problems described above, an object of the present invention is to provide a semiconductor circuit and a semiconductor device capable of solving the problems of the conventional semiconductor circuit and the conventional semiconductor device. In the present invention, it is possible to properly perform signal communication regardless of a change in a battery voltage due to a voltage variation.

Further objects and advantages of the invention will be apparent from the following description of the invention.

SUMMARY OF THE INVENTION

In order to attain the objects described above, according to a first aspect of the present invention, a semiconductor circuit includes a first terminal directly connected to a power source line connected in series to a plurality of power source supply portions including batteries; a first communication circuit for performing signal communication with a semiconductor circuit at a lower stage according to a first reference voltage and a first power source voltage supplied from the first terminal; and a second communication circuit for performing signal communication with a semiconductor circuit at a higher stage according to a second reference voltage greater than the first reference voltage thus supplied and a second power source voltage greater than the first power source voltage.

According to the first aspect of the present invention, the semiconductor circuit further includes a level shift circuit for level shifting a first signal to a level corresponding to the second reference voltage of the second communication circuit and the second power source voltage when the first signal is input to the first communication circuit from the semiconductor circuit at the lower stage. The level shift circuit is also provided for level shifting a second signal to a level corresponding to the first reference voltage of the first communication circuit and the first power source voltage when the second signal is input to the second communication circuit from the semiconductor circuit at the higher stage.

According to the first aspect of the present invention, the semiconductor circuit further includes a power source voltage output circuit for supplying the first power source voltage to the first communication circuit and outputting the first power source voltage externally.

According to the first aspect of the present invention, the semiconductor circuit further includes a second terminal connected to the power source line through a first filter for supplying a third power source voltage to the level shift circuit and the power source voltage output circuit; a third terminal directly connected to the power source line for supplying the second reference voltage to the second communication circuit; and a fourth terminal connected to the semiconductor circuit at the higher level for supplying the first power source voltage of the semiconductor circuit at the higher level output from the power source voltage output circuit in the semiconductor circuit at the higher level as the second power source voltage to the second communication circuit.

According to a second aspect of the present invention, in the semiconductor circuit in the first aspect of the present invention, a potential difference between the first reference voltage supplied to the first communication circuit and the first power source voltage is equal to a potential difference between the second reference voltage supplied to the second communication circuit and the second power source voltage.

According to a third aspect of the present invention, in the semiconductor circuit in the first aspect or the second aspect of the present invention, the first communication circuit and the second communication circuit are configured to perform the signal communication according to a differential signal.

According to a fourth aspect of the present invention, the semiconductor circuit in one of the first aspect to the third aspect of the present invention further includes a selection circuit connected to each of the batteries in the power source supply portions through a second filter for selecting one of the batteries in the power source supply portions.

According to a fifth aspect of the present invention, a semiconductor device includes the semiconductor circuit according to one of the first aspect to the fourth aspect of the present invention disposed per each of the power source supply portions.

As described above, in the present invention, it is possible to properly perform the signal communication regardless of a change in a battery voltage due to a voltage variation.

BRIEF DESCRIPTION OF THE DRAWINGS

FIG. 6 is a graph for explaining a false operation of the conventional semiconductor device.

DETAILED DESCRIPTION OF PREFERRED EMBODIMENTS

Hereunder, preferred embodiments of the present invention will be explained with reference to the accompanying drawings.

First Embodiment

Figure 1:
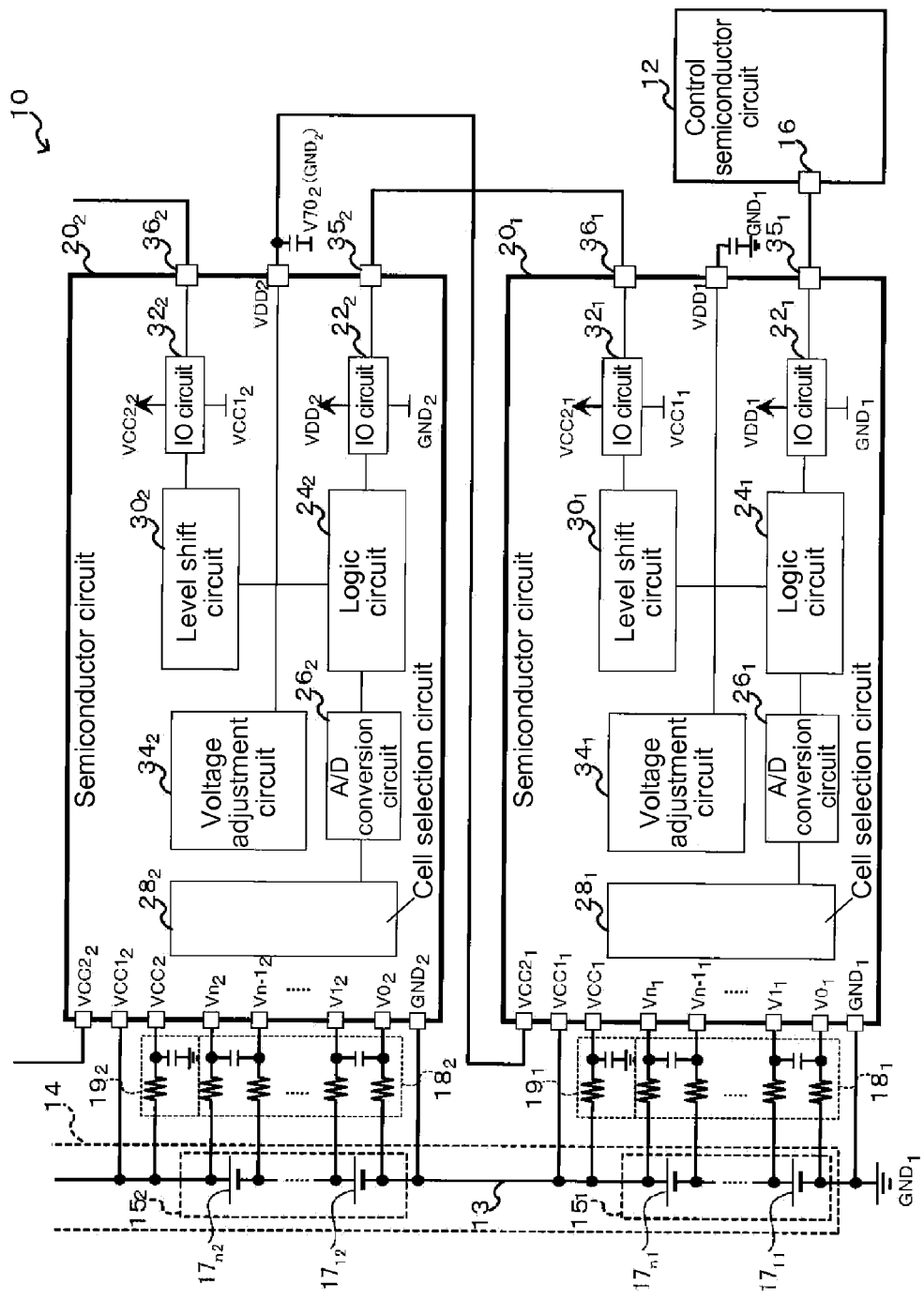
FIG. 1 is a block diagram showing a configuration of a battery monitoring system according to a first embodiment of the present invention.

A first embodiment of the present invention will be explained. FIG. 1 is a block diagram showing a configuration of a battery monitoring system according to the first embodiment of the present invention.

As shown in FIG. 1, the battery monitoring system includes a battery 14 including a plurality of battery cell groups 15 and a semiconductor device 10 for measuring and controlling a voltage of battery cells 17 of the battery 14.

In the battery monitoring system, a control semiconductor circuit 12 transmits a command (a signal) to a measurement semiconductor circuit 20. Accordingly, a cell voltage equalization process (equalizing the voltage of each of the battery cells 17) or a charging discharging control process (controlling charging and discharging of each of the battery cells 17) of the battery 14 accordingly to voltage information of each of the battery cells 17 obtained from the measurement semiconductor circuit 20.

In the semiconductor device 10 of the battery monitoring system, the semiconductor circuit 20 is provided for each of the battery cell groups 15. In the following description, when it is necessary to differentiate each of the semiconductor circuits 20, a subscript number is attached to the reference numeral. When the semiconductor circuits 20 are referred collectively, the subscript number is omitted.

In the semiconductor device 10, the semiconductor circuit 20 includes an IO circuit 22 for operating at a GND-VDD level on a low potential side and an IO circuit 32 for operating at a VCC-VCC2 level on a high potential side. It is noted that a reference voltage VCC1 and a power source voltage VCC2 are supplied to the IO circuit 32. Accordingly, the semiconductor circuits 20 are configured to mutually exchange the command signals and the data signals such as measurement results without passing through a power source separation element.

In the semiconductor device 10, the GND level (the $GND_1$) of the semiconductor circuit $20_1$ is not limited to a voltage value of 0 V, and may be an arbitrary value. Further, a semiconductor circuit 20 connected to the IO circuit 32 is referred to as the semiconductor circuit 20 at a higher stage, and a semiconductor circuit 20 connected to the IO circuit 22 is referred to as the semiconductor circuit 20 at a lower stage. The semiconductor circuit 20 at the higher stage has the GND level greater (a higher voltage value) than the semiconductor circuit 20 at the lower stage.

In the battery monitoring system in the embodiment, the semiconductor circuit 20 includes a logic circuit 24, an A/D conversion circuit 26, a cell selection circuit 28, a level shift circuit 30, and a voltage adjustment circuit 34.

In the embodiment, the logic circuit 24 is a circuit having a function of decoding the command signal input thereto. More specifically, the logic circuit 24 has a function of decoding the command signal input thereto, and for determining whether the voltage measurement of the semiconductor circuit 20 is instructed. The A/D conversion circuit 26 is a circuit having a function of performing an A/D (analog/digital) conversion on the signal input thereto.

In the embodiment, the cell selection circuit 28 is a circuit having a function of selecting one of the battery cells 17 whose voltage is to be measured according to the command signal, and of outputting a voltage value of the one of the battery cells 17 thus selected (described in more detail later). The level shift circuit 30 is a circuit having a function of performing a level shift on a level of the signal between the GND-VDD level on the low potential side and the VCC1-VCC2 level on the high potential side. The voltage adjustment circuit 34 is a circuit having a function of outputting a VDD voltage to be as a power source voltage of the IO circuit 22.

In the battery monitoring system in the embodiment, the semiconductor circuit 20 further includes a VCC terminal; a VCC1 terminal; a VCC2 terminal; a VDD terminal; and Vn terminals (n=0 to n, n is an integer).

In the embodiment, the VCC terminal is connected to a power source line 13 of the battery 14 through an RC filter 19 to stabilize a power source voltage VCC for supplying the power source voltage VCC to the logic circuit 24, the cell selection circuit 28, the level shift circuit 30, and the voltage adjustment circuit 34. The VCC1 terminal is directly connected to the power source line 13 for supplying a reference voltage VCC1 of the IO circuit 32. The VCC2 terminal is connected to the semiconductor circuit 20 at the higher stage for receiving an output voltage VDD output from the voltage adjustment circuit 34 of the semiconductor circuit 20 at the higher stage, and for supplying a power source voltage of the IO circuit 32. The Vn terminals are provided for connecting a positive electrode and a negative electrode of each of the battery cells 17. A LPF (low pass filter) 18 is disposed between each of the Vn terminals and the power source line 13 for stabilizing the power source voltage.

An operation of the battery monitoring system for measuring the voltage of the battery cells 17 will be explained. In the following description, one of the battery cells $17_2$ ($17_{12}$ to $17_{n2}$) of the battery cell group $15_2$ will be explained.

In the battery monitoring system, when the voltage of the battery cells $17_{12-n2}$ measured, the control semiconductor circuit 12 transmits the command signal for measuring the voltage of the battery cell $17_{12-n2}$. It is noted that the command signal contains information pertaining to which one of the battery cell $17_{12-n2}$ is measured.

When the command signal is input to the IO circuit $22_2$ of the semiconductor circuit $20_2$ through a communication terminal $35_2$, the logic circuit $24_1$ decodes the command signal to determine whether the command signal is the command signal for instructing the measurement of the voltage of the battery cell $17_{12-n2}$ connected to the semiconductor circuit $20_2$.

When the logic circuit $24_2$ determines that the command signal is the command signal for instructing the measurement of the voltage of the battery cell $17_{12-n2}$ connected to the semiconductor circuit $20_2$, the logic circuit $24_2$ outputs the control signal to the A/D conversion circuit $26_2$ and the cell selection circuit $28_2$. The cell selection circuit $28_2$ selects one of the battery cell $17_2$ ($17_{21-n2}$) specified according to the control signal through an internal switch (switching). Then, the cell selection circuit $28_1$ outputs the voltage of the one of the battery cell $117_{12-n2}$ to the A/D conversion circuit $26_2$.

Figure 2:
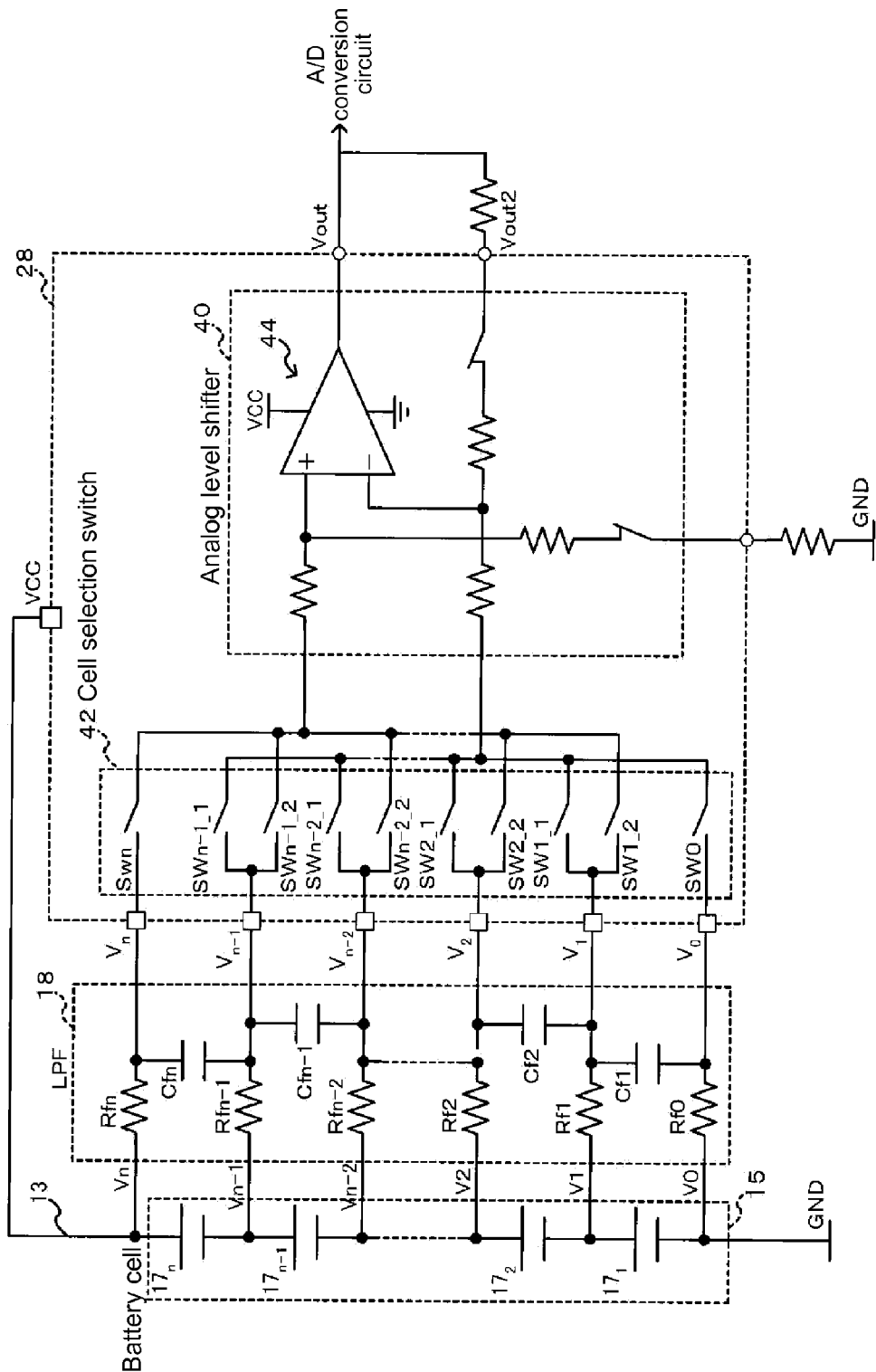
FIG. 2 is a circuit diagram showing a cell selection circuit of a semiconductor circuit of the battery monitoring system according to the first embodiment of the present invention.

FIG. 2 is a circuit diagram showing the cell selection circuit 28 of the semiconductor circuit 20 of the battery monitoring system according to the first embodiment of the present invention.

As shown in FIG. 2, the cell selection circuit 28 includes an analog level shifter 40 and a cell selection switch 42. The cell selection circuit 28 is connected to the power source line 13 on the positive electrode side of the battery cells $17_n$ so that the power source voltage VCC is supplied from the power source line 13 to the cell selection circuit 28. Both end portions of each of the battery cells $17_n$ are connected to input terminals of the cell selection switch 42 of the cell selection circuit 28 through the LPF 18. Output terminals of the cell selection switch 42 are connected to the analog level shifter 40. The analog level shifter 40 is formed of a detection resistor, an amplifier 44, and a dummy switch. The dummy switch is turned on all the time.

In the embodiment, when the voltage of the battery cell $17_n$ is measured, switching elements $SW_n$ and $Sw_{n-1\_1}$ of the cell selection switch 42 are turned on, and other switching elements are turned off. The analog level shifter 40 converts the voltage of the battery cell $17_n$ (equal to $V_n-V_{n-1}$), so that the voltage of the battery cell $17_n$ becomes $V_{out}$ and is converted to the voltage with the GND reference, thereby outputting to the A/D conversion circuit 26.

In the embodiment, when the voltage of the battery cell 17 other than the battery cell $17_n$ is measured, similar to the process described above, a switching element connected to the positive side of the battery cell 17 and a switching element connected to the negative side of the battery cell 17 are turned on, and other switching elements are turned off.

In the embodiment, when the voltage of the battery cell $17_2$ thus selected is output from the cell selection circuit $28_2$ to the A/D conversion circuit $26_2$, the A/D conversion circuit $26_2$ outputs the data signal, in which the voltage thus input is converted to a digital value, to the logic circuit $24_2$. Further, the data signal returns back through the path of the command signal transmission, and is output to the control semiconductor circuit 12.

Figure 3:
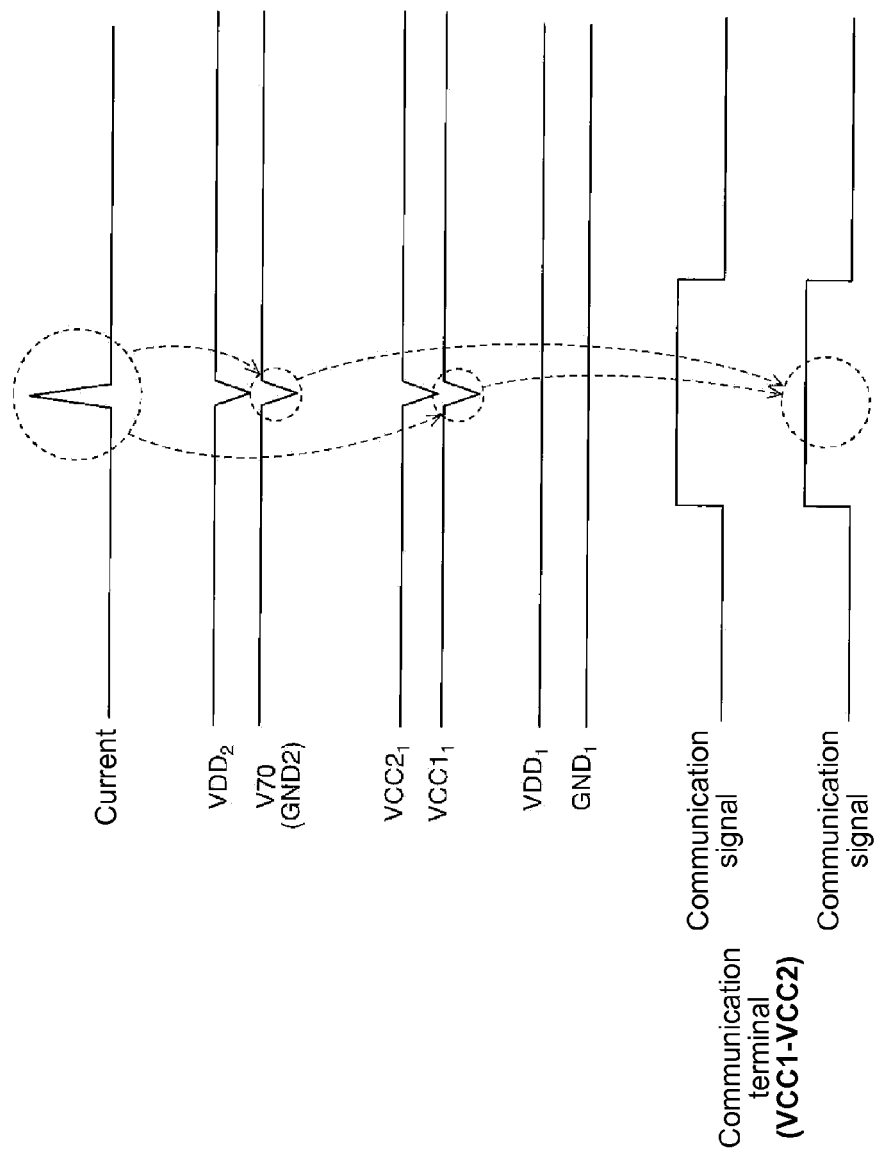
FIG. 3 is a graph for explaining an operation of the semiconductor device of the battery monitoring system according to the first embodiment of the present invention.

An operation of the battery monitoring system will be explained with reference to FIG. 3 in a case that a noise, in which the battery voltage changes suddenly, is generated due to a load current or a charging current generated in a regenerative brake system when a brake is applied. FIG. 3 is a graph for explaining the operation of the semiconductor device 10 of the battery monitoring system according to the first embodiment of the present invention.

In the embodiment, when the battery voltage decreases due to the sudden current change, a voltage V70 (the GND level ($GND_2$) of the semiconductor circuit $20_2$) decreases, thereby decreasing the voltage. When the GND level ($GND_2$) of the semiconductor circuit $20_2$ changes, the voltage $VCC2_1$ (the GND level ($GND_2$) of the semiconductor circuit $20_2$) input into the $VCC2_1$ terminal of the semiconductor circuit $20_1$ decreases as well.

In the embodiment, the $VCC1_1$ terminal of the semiconductor circuit $20_1$ is directly connected to the power source line $13_1$. Accordingly, the sudden voltage change is generated as well without cutting the noise. As a result, the voltage $VCC2_1$ changes, and the voltage $VCC1_1$ changes as well. Therefore, a potential difference between the voltage $VCC2_1$ and the voltage $VCC1_1$ becomes constant regardless of the voltage change. Accordingly, the communication signal input into the IO circuit $32_1$ does not change, and the logic inversion does not take place, thereby preventing the false operation.

As explained above, in the embodiment, the semiconductor circuit 20 includes the VCC terminal connected to the VDD output of the semiconductor circuit 20 at the higher stage, and the VCC1 terminal directly connected to the power source line 13. Further, the power source voltage VCC2 is supplied to the IO circuit 32 on the high potential side from the VCC2 terminal, and the reference voltage VCC1 is supplied to the IO circuit 32 on the high potential side from the VCC1 terminal. Further, the semiconductor circuit 20 includes the VCC terminal connected to the power source line 13 of the battery 14 through the RC filter 19, so that the power source voltage VCC is supplied from the terminal VCC to the logic circuit 24, the A/D conversion circuit 26, the cell selection circuit 28, the level shift circuit 30, and the voltage adjustment circuit 34.

In general, a terminal for supplying a power source voltage is connected to a power source line through an LPF to cut the high frequency component, so that the power source voltage is stabilized. In the embodiment, the VCC terminal is connected to the power source line 13 of the battery 14 through the RC filter 19 to stabilize the power source voltage VCC for supplying the power source voltage VCC to the logic circuit 24, the A/D conversion circuit 26, the cell selection circuit 28, the level shift circuit 30, and the voltage adjustment circuit 34. With the configuration, it is possible to stably operate the logic circuit 24, the A/D conversion circuit 26, the cell selection circuit 28, the level shift circuit 30, and the voltage adjustment circuit 34.

Figure 5:
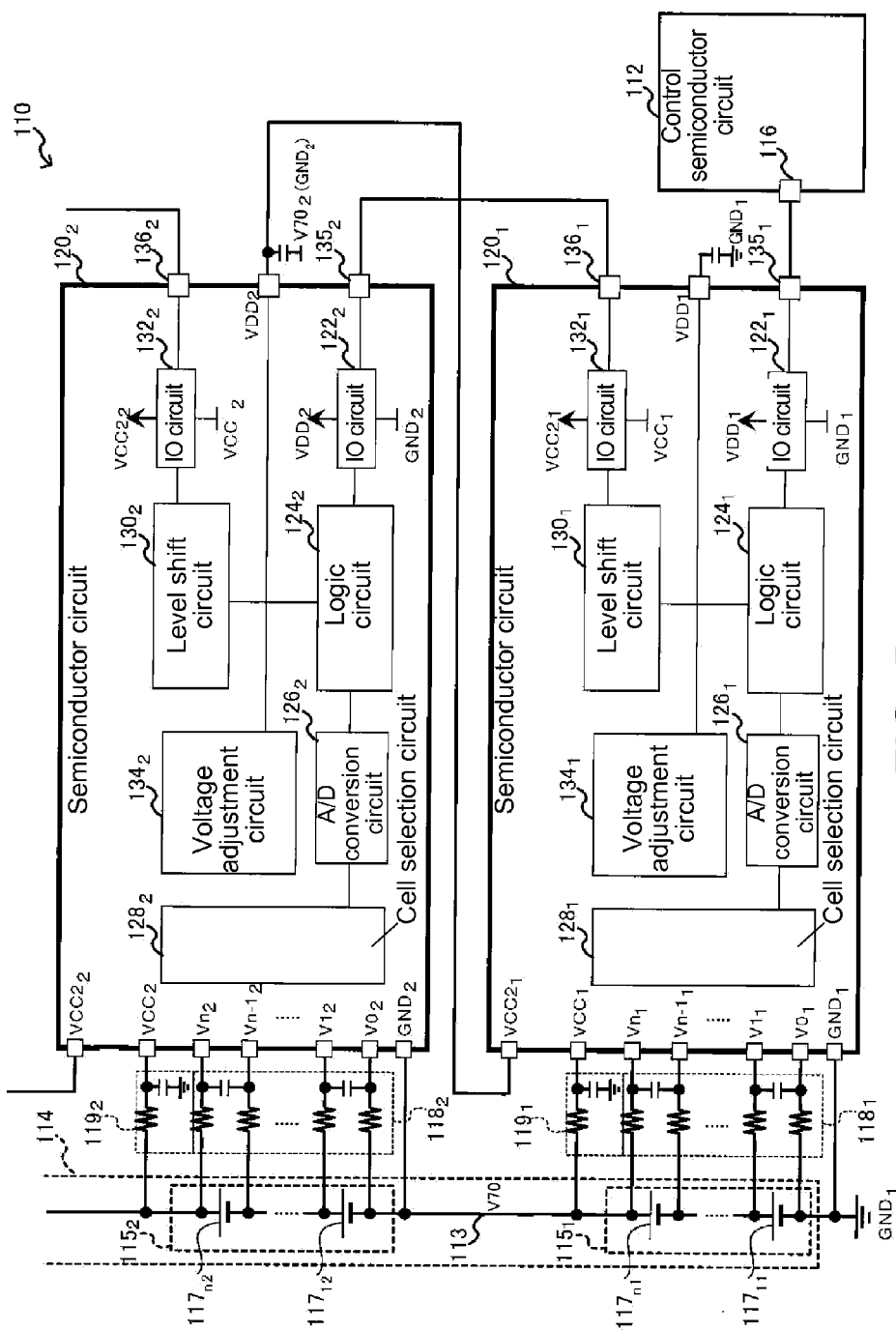
FIG. 5 is a block diagram showing a configuration of a conventional semiconductor device.

In the conventional battery monitoring system shown in FIG. 5, it is desirable to stably supply the power source voltage and the reference voltage, thereby stabilizing the operation of the conventional battery monitoring system. Accordingly, the terminal for supplying the power source voltage to the IO circuit 132 is connected to the power source line 113 through the RC filter 119.

On the other hand, in the embodiment, the terminal VCC1 is directly connected to the power source line 13, and the reference voltage VCC1 is supplied to the IC circuit 32 from the terminal VCC1. Accordingly, the reference voltage VCC1 changes according to the change in the battery voltage due to the load current. However, the power source voltage VCC2 that is supplied to the IC circuit 32 from the semiconductor circuit 20 at the higher stage through the terminal VCC2 changes as well. Therefore, the potential difference between the voltage $VCC2_1$ and the voltage $VCC1_1$ becomes constant. Accordingly, the communication signal is not affected, and the false operation is prevented, thereby properly performing the signal communication regardless of the battery voltage change.

In the embodiment, the terminal VCC1 is directly connected to the power source line 13. Alternatively, in a case that the power source line 13 is drawn to a large extent to cause a delay and a shift between the signal transmitted to the power source voltage VCC2 and the signal transmitting the reference voltage VCC1 is generated, a filter such as an LPF may be disposed between the terminal VCC1 and the power source line 13 such that the shift is reduced. In this case, the voltage change value of the power source voltage VCC2 does not become equal to the voltage change value of the reference voltage VCC1. Even when the potential difference is generated to some extent, as far as the potential difference thus generated does not exceed the threshold value of the logic level inversion, it is expected to cause no serious problem, and it is possible to obtain an effect of the present invention.

Second Embodiment

Figure 4:
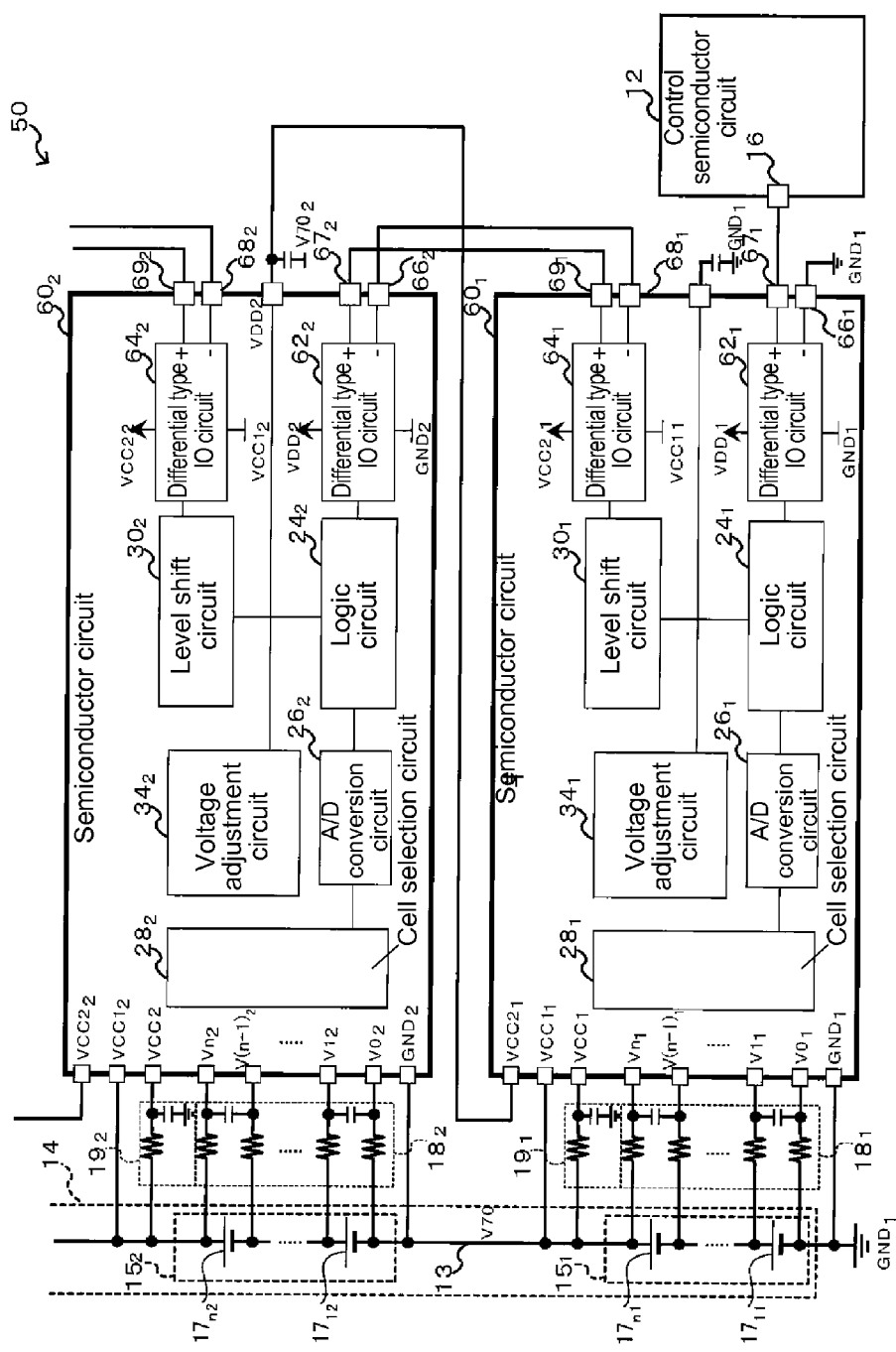
FIG. 4 is a block diagram showing a configuration of a battery monitoring system according to a second embodiment of the present invention.

A second embodiment of the present invention will be explained next with reference to FIG. 4. FIG. 4 is a block diagram showing a configuration of a battery monitoring system according to the second embodiment of the present invention. The battery monitoring system according to the second embodiment of the present invention has the configuration similar to that of the battery monitoring system according to the first embodiment of the present invention. Accordingly, components in the second embodiment similar to those in the first embodiment are designated with the same reference numerals, and explanations thereof are omitted.

As shown in FIG. 4, in a semiconductor circuit 60 of the battery monitoring system in the second embodiment includes an IO circuit 62 and an IO circuit 64 of a differential type, instead of the IO circuit 22 and the IO circuit 32 of the single end type in the first embodiment. Accordingly, while the signal is transmitted and received through one single signal line in the first embodiment, the signal is transmitted and received through two signal lines in the second embodiment.

In the second embodiment, the data is transmitted between the semiconductor circuits 60 with the differential signal using the two signal lines. Accordingly, it is possible to reduce the noise other than the voltage change due to the battery voltage change such as the radiation noise as described above. As a result, it is possible to perform the data communication more properly.

The disclosure of Japanese Patent Application No. 2010-183292, filed on Aug. 18, 2010, is incorporated in the application by reference.

While the invention has been explained with reference to the specific embodiments of the invention, the explanation is illustrative and the invention is limited only by the appended claims.

What is claimed is:

1. A semiconductor circuit connected to a lower stage semiconductor chip and a higher stage semiconductor chip, comprising:

a first terminal directly connected to a power source line connected in series to a plurality of power source supply portions;

a first communication circuit for performing signal communication with the lower stage semiconductor chip according to a first reference voltage supplied from the first terminal and a first power source voltage;

a second communication circuit for performing signal communication with the higher stage semiconductor chip according to a second reference voltage greater than the first reference voltage and a second power source voltage greater than the first power source voltage and the second reference voltage;

a level shift circuit for level shifting a first signal to a level corresponding to the second reference voltage of the second communication circuit and the second power source voltage when the first signal is input to the first communication circuit from the lower stage semiconductor chip, said level shift circuit being arranged to level shift a second signal to a level corresponding to the first reference voltage of the first communication circuit and the first power source voltage when the second signal is input to the second communication circuit from the higher stage semiconductor chip;

a voltage adjustment circuit for supplying the first power source voltage to the first communication circuit and outputting the first power source voltage externally;

a second terminal connected to the power source line through a first filter for supplying a third power source voltage to the voltage adjustment circuit;

a third terminal directly connected to the power source line without disposing any grounded circuitry element in parallel to the third terminal and the power source line for supplying the second reference voltage to the second communication circuit; and a fourth terminal connected to the higher stage semiconductor chip for supplying the first power source voltage of the higher stage semiconductor chip output from the higher stage semiconductor chip as the second power source voltage to the second communication circuit.

2. The semiconductor circuit according to claim 1, wherein said first communication circuit is arranged so that a potential difference between the first reference voltage supplied to the first communication circuit and the first power source voltage is equal to a potential difference between the second reference voltage supplied to the second communication circuit and the second power source voltage.

3. The semiconductor circuit according to claim 1, wherein said first communication circuit and said second communication circuit are arranged to perform the signal communication according to a differential signal.

4. The semiconductor circuit according to claim 1, further comprising a selection circuit connected to each of the power source supply portions through a second filter for selecting one of the power source supply portions.

5. A semiconductor device comprising the semiconductor circuit according to claim 1 disposed per each of the power source supply portions.

6. The semiconductor circuit according to claim 3, wherein said first communication circuit is arranged to directly connect to the lower stage semiconductor chip through two separate lines so that the first communication circuit performs the signal communication with the lower stage semiconductor chip according to the differential signal.

7. The semiconductor circuit according to claim 3, wherein said second communication circuit is arranged to directly connect to the upper stage semiconductor chip through two separate lines so that the second communication circuit performs the signal communication with the higher stage semiconductor chip according to the differential signal.

8. A battery assembly system, comprising:
- a battery assembly including a plurality of battery cells connected in series; and
- a voltage monitoring system including a plurality of voltage monitoring devices for monitoring a voltage of a specific number of the battery cells through a first resistor circuit,
- wherein at least one of said voltage monitoring devices comprises:
- a first communication circuit for performing communication with a lower stage voltage monitoring device according to a first upper stage reference voltage and a first lower stage reference voltage smaller than the first upper stage reference voltage;
- a second communication circuit for performing communication with an upper stage voltage monitoring device according to a voltage level between a second upper stage reference voltage supplied from the upper stage voltage monitoring device as the first upper stage reference voltage and a second lower stage reference voltage smaller than the second upper stage reference voltage and greater than the first lower stage reference voltage;
- a first terminal for receiving the first lower stage reference voltage from the battery assembly;
- a second terminal for outputting the first upper stage reference voltage;
- a third terminal directly connected to the battery assembly without disposing any grounded circuitry element in parallel to the third terminal and the battery assembly for receiving the second lower stage reference voltage from the battery assembly;
- a fourth terminal for receiving the first upper stage reference voltage output from the upper stage voltage monitoring device;
- a first wiring portion for connecting the battery assembly and the first terminal, said first wiring portion having a first resistivity;
- a second wiring portion for connecting the battery assembly and the third terminal, said second wiring portion having a second resistivity;
- a third wiring portion for connecting the upper stage voltage monitoring device and the fourth terminal, said third wiring portion having a third resistivity; and
- a fourth wiring portion for connecting the battery assembly and the at least one of the voltage monitoring devices through the first resistor circuit.

9. The battery assembly system according to claim 8, wherein said first communication circuit is configured to perform communication with the lower stage voltage monitoring device according to the first upper stage reference voltage and the first lower stage reference voltage so that a difference between the first upper stage reference voltage and the first lower stage reference voltage becomes equal to a difference between the second upper stage reference voltage and the second lower stage reference voltage.

10. The battery assembly system according to claim 8, wherein said fourth wiring portion includes a filter circuit including the first resistor circuit.

11. The battery assembly system according to claim 8, wherein said first communication circuit is configured to perform communication with the lower stage voltage monitoring device according to the first upper stage reference voltage smaller than the second upper stage reference voltage and the first lower stage reference voltage smaller than the second lower stage reference voltage.

12. The battery assembly system according to claim 8, wherein said fourth wiring portion is configured to receive a potential of one of the battery cells at a highest stage as the second lower stage reference voltage.

13. The battery assembly system according to claim 8, further comprising a signal level conversion circuit for converting a voltage level of a signal received with the first communication circuit to a voltage range of the second communication circuit, or for converting a signal level conversion circuit for converting a voltage level of a signal received with the second communication circuit to a voltage range of the first communication circuit.

14. The battery assembly system according to claim 8, further comprising a voltage generation circuit for supplying the first upper stage reference voltage to the first communication circuit and the second terminal.

15. The battery assembly system according to claim 8, wherein said first communication circuit and said second communication circuit are arranged to perform communication according to a differential signal.

16. The battery assembly system according to claim 8, wherein said first terminal and said third terminal are directly connected to the battery assembly.

* * * * *